United States Patent
Yamada

(10) Patent No.: US 10,908,411 B2
(45) Date of Patent: Feb. 2, 2021

(54) ACTUATOR AND OPTICAL SCANNING DEVICE

(71) Applicant: Kensuke Yamada, Tokyo (JP)

(72) Inventor: Kensuke Yamada, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 119 days.

(21) Appl. No.: 16/296,472

(22) Filed: Mar. 8, 2019

(65) Prior Publication Data

US 2019/0285874 A1    Sep. 19, 2019

(30) Foreign Application Priority Data

Mar. 15, 2018  (JP) .................................. 2018-048094

(51) Int. Cl.
| | |
|---|---|
| G02B 26/08 | (2006.01) |
| H02N 2/06 | (2006.01) |
| H02N 2/04 | (2006.01) |
| G02B 26/10 | (2006.01) |

(52) U.S. Cl.
CPC ......... *G02B 26/0858* (2013.01); *G02B 26/10* (2013.01); *H02N 2/046* (2013.01); *H02N 2/06* (2013.01)

(58) Field of Classification Search
None
See application file for complete search history.

(56) References Cited

U.S. PATENT DOCUMENTS

| | | | |
|---|---|---|---|
| 6,995,896 B2 | 2/2006 | Yamabana et al. | |
| 8,964,273 B2 | 2/2015 | Horie et al. | |
| 2003/0042801 A1* | 3/2003 | Miyajima | H02P 25/032 310/36 |
| 2011/0110204 A1* | 5/2011 | Hashizume | G11B 7/1369 369/44.23 |
| 2014/0126923 A1* | 5/2014 | Mizutani | G06K 15/1219 399/51 |

FOREIGN PATENT DOCUMENTS

| | | |
|---|---|---|
| JP | 2004-361920 | 12/2004 |
| JP | 2012-055852 | 3/2012 |
| JP | 2013-186145 | 9/2013 |
| JP | 2016-001325 | 1/2016 |

* cited by examiner

*Primary Examiner* — Jennifer D. Carruth
(74) *Attorney, Agent, or Firm* — IPUSA, PLLC

(57) ABSTRACT

An actuator includes a beam that supports an object to be driven, and a driving source that receives a driving signal and causes the object to rotate around a predetermined axis. The driving signal includes a sawtooth driving waveform, and a differential waveform of a falling section of the sawtooth driving waveform is formed of half sign waves having a wavelength that is a non-integral multiple of a ringing wavelength.

14 Claims, 12 Drawing Sheets

ACTUATOR AND OPTICAL SCANNING DEVICE

CROSS-REFERENCE TO RELATED APPLICATION

The present application is based upon and claims priority to Japanese Patent Application No. 2018-048094, filed on Mar. 15, 2018, the entire contents of which are incorporated herein by reference.

BACKGROUND OF THE INVENTION

1. Field of the Invention

An aspect of this disclosure relates to an actuator and an optical scanning device.

2. Description of the Related Art

There is a known optical scanning device where a mirror is rotated around a rotational axis to scan light reflected by the mirror by using an actuator including, as a driving source, a piezoelectric element that includes an upper electrode formed on the upper surface of a piezoelectric thin film and a lower electrode formed on the lower surface of the piezoelectric thin film. The actuator also includes an upper wire connected to the upper electrode and a lower wire connected to the lower electrode that are used to apply a voltage to the piezoelectric thin film (see, for example, Japanese Laid-Open Patent Publication No. 2016-001325 and Japanese Patent No. 5876329).

In the optical scanning device, a voltage with a sawtooth waveform is used to drive the actuator, and "ringing" may occur due to resonant oscillation of the mirror when the actuator is driven. The ringing may reduce the quality of images formed by scanning light with the optical scanning device.

Japanese Laid-Open Patent Publication No. 2012-055852 discloses a feedback control where a tilt angle corresponding to an input sawtooth waveform is sensed, and a frequency filter is applied to a driving waveform to remove ringing components.

In Japanese Laid-Open Patent Publication No. 2004-361920, a driving waveform is filtered to remove resonant frequency components from known frequency components.

However, when a method where a frequency filter is applied to the entire driving waveform is used for a sawtooth waveform with step-like main-scanning sections, the steps may become blunt and necessary straight sections may not be obtained. Also, although a filtering method is effective for a continuously-repeated sawtooth waveform, the method cannot achieve an appropriate ringing suppression effect in a case where the frequency of the sawtooth waveform fluctuates or a case where a wait time occurs irregularly between sawtooth waveforms.

SUMMARY OF THE INVENTION

In an aspect of this disclosure, there is provided an actuator including a beam that supports an object to be driven, and a driving source that receives a driving signal and causes the object to rotate around a predetermined axis. The driving signal includes a sawtooth driving waveform, and a differential waveform of a falling section of the sawtooth driving waveform is formed of half sign waves having a wavelength that is a non-integral multiple of a ringing wavelength.

DESCRIPTION OF THE PREFERRED EMBODIMENTS

Embodiments of the present invention are described below with reference to the accompanying drawings. Throughout the accompanying drawings, the same reference numbers are used for the same components, and repeated descriptions of those components may be omitted.

Embodiment

Figure 1A:
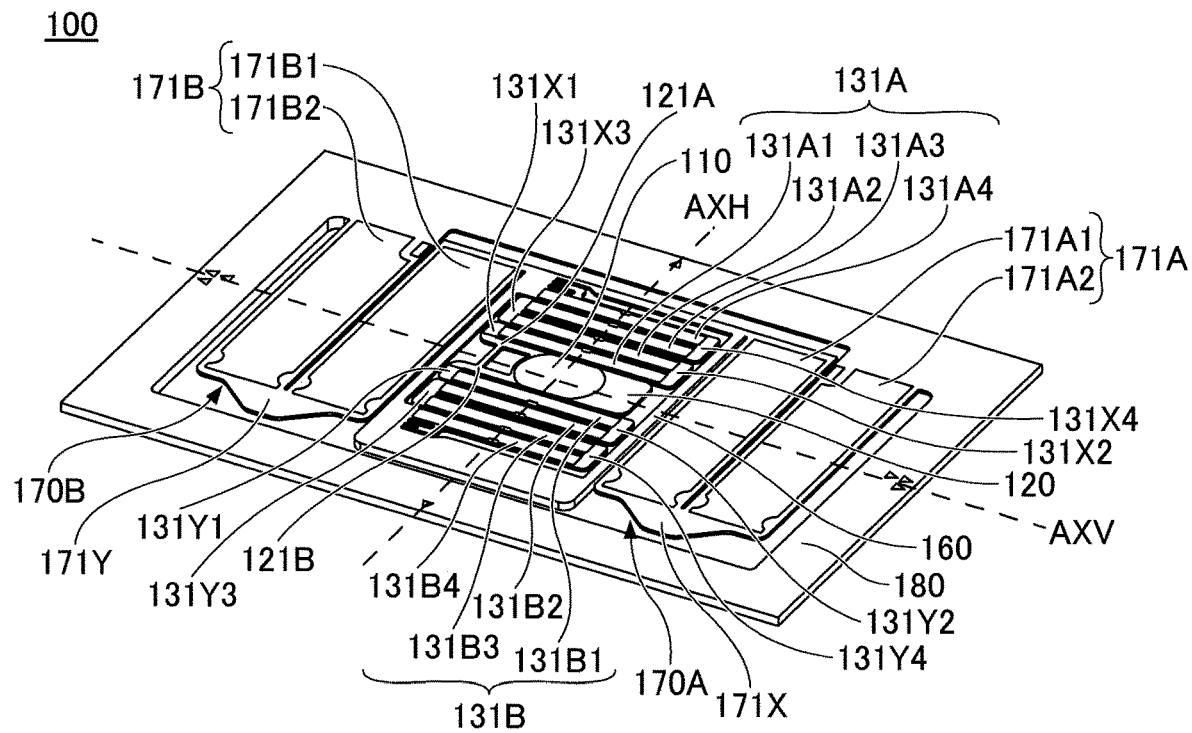
FIG. 1A is a top perspective view of an optical scanner of an optical scanning device according to an embodiment.
Figure 1B:
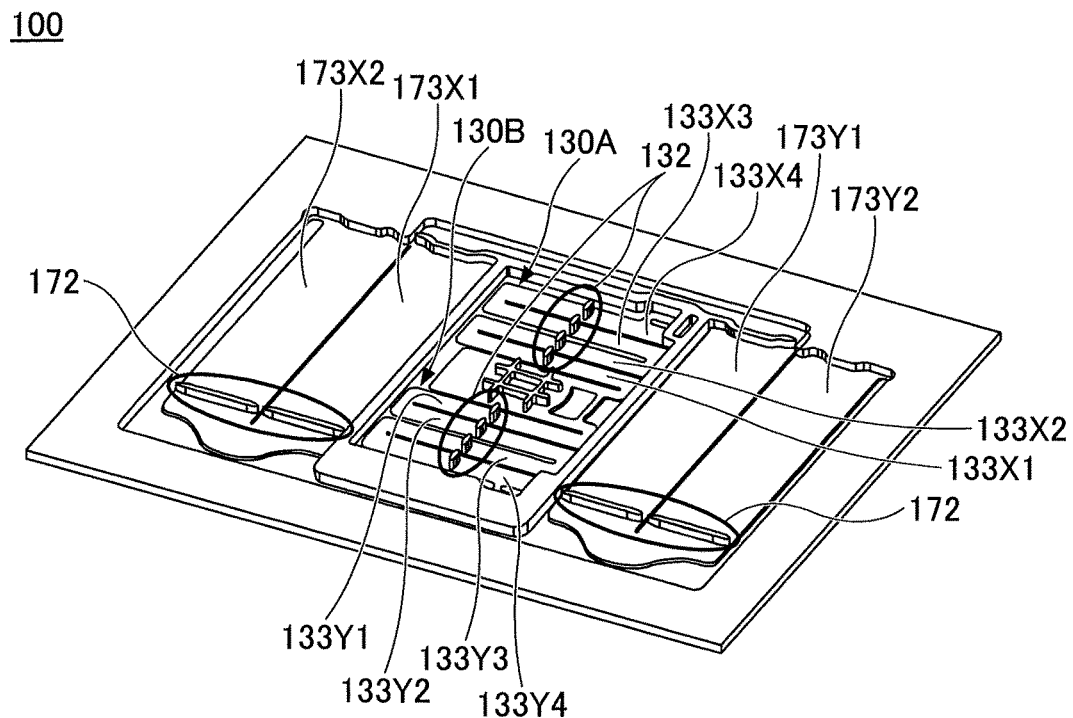
FIG. 1B is a bottom perspective view of the optical scanner of FIG. 1A.
Figure 2:
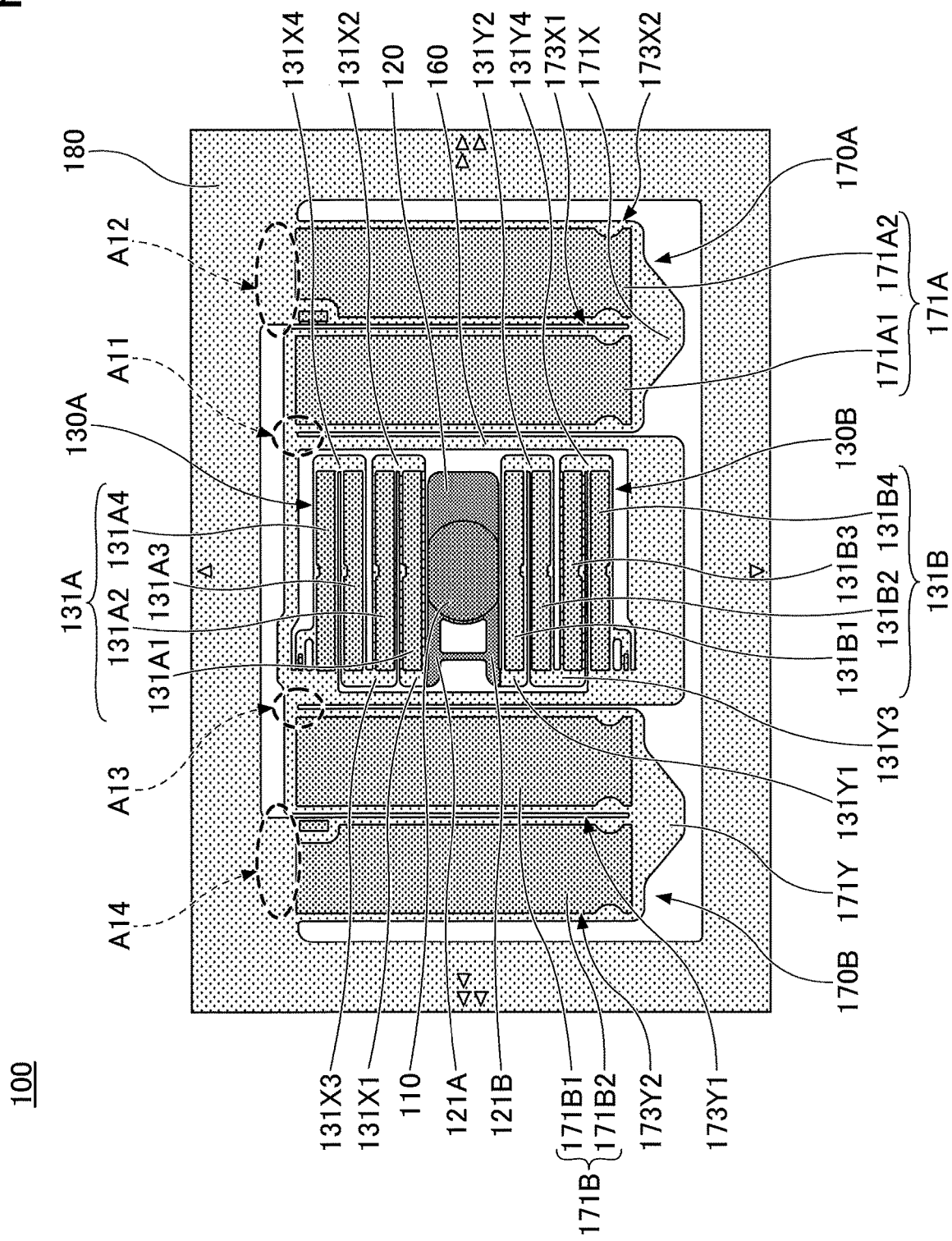
FIG. 2 is a top plan view of the optical scanner of FIG. 1A.

FIG. 1A is a top perspective view of an optical scanner 100 of an optical scanning device according to an embodiment. FIG. 1B is a bottom perspective view of the optical scanner 100 of FIG. 1A. FIG. 2 is a top plan view of the optical scanner 100 of FIG. 1A. The optical scanner 100 may be housed in a ceramic package including a package body and a package cover.

The optical scanner 100 scans an incoming laser beam emitted by a light source by causing a mirror 110 to rotate (or oscillate). The optical scanner 100 is, for example, a MEMS mirror where the mirror 110 is driven by driving sources such as piezoelectric elements. The mirror 110 of the optical scanner 100 reflects an incoming laser beam and scans the reflected laser beam two-dimensionally.

As illustrated in FIGS. 1A, 1B, and 2, the optical scanner 100 includes the mirror 110, a mirror support 120, coupling beams 121A and 121B, horizontal driving beams 130A and 130B, a movable frame 160, vertical driving beams 170A and 170B, and a fixed frame 180. The mirror 110 is supported on an upper surface of the mirror support 120.

The horizontal driving beams 130A and 130B for supporting the mirror 110 and the mirror support 120 are connected to the mirror support 120 and disposed on the corresponding sides of the mirror support 120 for supporting the mirror 110. The horizontal driving beams 130A and 130B are connected to the mirror support 120 via the coupling beams 121A and 121B. The horizontal driving beams 130A and 130B, the coupling beams 121A and 121B, the mirror support 120, and the mirror 110 are supported by the movable frame 160 surrounding these components. The horizontal driving beam 130A includes multiple rectangular horizontal beams 133X1, 133X2, 133X3, and 133X4 that extend in the direction of a vertical-rotation axis AXV that is orthogonal to a horizontal-rotation axis AXH, and ends of adjacent horizontal beams are connected to each other via turnaround parts 131X2, 131X3, and 131X4 such that the horizontal driving beam 130A forms a zig-zag bellows structure as a whole. One end of the horizontal driving beam 130A is connected to the inner side of the movable frame 160, and another end of the horizontal driving beam 130A is connected via a turnaround part 131X1 and the coupling beam 121A to the mirror support 120. The horizontal driving beam 130B includes multiple rectangular horizontal beams 133Y1, 133Y2, 133Y3, and 133Y4 that extend in the direction of the vertical-rotation axis AXV that is orthogonal to the horizontal-rotation axis AXH, and ends of adjacent horizontal beams are connected to each other via turnaround parts 131Y2, 131Y3, and 131Y4 such that the horizontal driving beam 130B forms a zig-zag bellows structure as a whole. One end of the horizontal driving beam 130B is connected to the inner side of the movable frame 160, and another end of the horizontal driving beam 130B is connected via a turnaround part 131Y1 and the coupling beam 121B to the mirror support 120.

The vertical driving beams 170A and 170B connected to the movable frame 160 are disposed on the corresponding sides of the movable frame 160. The vertical driving beam 170A includes multiple rectangular vertical beams 173X1 and 173X2 that extend in the direction of the horizontal-rotation axis AXH, and ends of adjacent vertical beams are connected to each other via a turnaround part 171X such that the vertical driving beam 170A forms a zig-zag bellows structure as a whole. One end of the vertical driving beam 170A is connected to the inner side of the fixed frame 180, and another end of the vertical driving beam 170A is connected to the outer side of the movable frame 160. The vertical driving beam 170B includes multiple rectangular vertical beams 173Y1 and 173Y2 that extend in the direction of the horizontal-rotation axis AXH, and ends of adjacent vertical beams are connected to each other via a turnaround part 171Y such that the vertical driving beam 170B forms a zig-zag bellows structure as a whole. One end of the vertical driving beam 170B is connected to the inner side of the fixed frame 180, and another end of the vertical driving beam 170B is connected to the outer side of the movable frame 160.

The horizontal driving beams 130A and 130B include, respectively, horizontal driving sources 131A and 131B that are piezoelectric elements. Also, the vertical driving beams 170A and 170B include, respectively, vertical driving sources 171A and 171B that are piezoelectric elements. The horizontal driving beams 130A and 130B and the vertical driving beams 170A and 170B function as an actuator that causes the mirror 110 to rotate (or oscillate) vertically and horizontally to scan a laser beam.

On the upper surfaces of the horizontal driving beams 130A and 130B, the horizontal driving sources 131A and 131B are formed for respective horizontal beams that are rectangular units including no curved section. Each of the horizontal driving sources 131A is a piezoelectric element formed on the upper surface of the horizontal driving beam 130A and includes a piezoelectric thin film, an upper electrode formed on the upper surface of the piezoelectric thin film, and a lower electrode formed on the lower surface of the piezoelectric thin film. Each of the horizontal driving sources 131B is a piezoelectric element formed on the upper surface of the horizontal driving beam 130B and includes a piezoelectric thin film, an upper electrode formed on the upper surface of the piezoelectric thin film, and a lower electrode formed on the lower surface of the piezoelectric thin film.

In each of the horizontal driving beams 130A and 130B, a driving voltage with a first waveform and a driving voltage with a second waveform obtained by vertically inverting the first waveform with reference to the median value of the first waveform are applied to horizontal driving sources 131A/131B on adjacent horizontal beams to cause the adjacent horizontal beams to warp in opposite vertical directions, and the accumulation of the vertical movement of the horizontal beams is transmitted to the mirror support 120. In the present embodiment, each of the first waveform and the second waveform is a sawtooth waveform. With the movement of the horizontal driving beams 130A and 130B, the mirror 110 and the mirror support 120 rotate (or oscillate) around the horizontal-rotation axis AXH. The direction of this rotation (or oscillation) is referred to as a horizontal direction, and the axis of this rotation (or oscillation) that passes through the center of the light reflection surface of the mirror 110 is referred to as the horizontal-rotation axis AXH. For example, nonresonant oscillation may be used for the horizontal driving by the horizontal driving beams 130A and 130B.

For example, the horizontal driving source 131A includes horizontal driving sources 131A1, 131A2, 131A3, and 131A4 that are formed on the first through fourth horizontal beams constituting the horizontal driving beam 130A. The horizontal driving source 131B includes horizontal driving sources 131B1, 131B2, 131B3, and 131B4 that are formed on the first through fourth horizontal beams constituting the horizontal driving beam 130B. In this case, the mirror 110 and the mirror support 120 can be rotated in the horizontal direction by driving the horizontal driving sources 131A1, 131B1, 131A3, and 131B3 using the first waveform and driving the horizontal driving sources 131A2, 131B2, 131A4, and 131B4 using the second waveform that is obtained by vertically inverting the first waveform with reference to the median value of the first waveform.

On the upper surfaces of the vertical driving beams 170A and 170B, the vertical driving sources 171A and 171B are formed for respective vertical beams 173X1, 173X2, 173Y1, and 173Y2 that are rectangular units including no curved section. Each vertical driving source 171A is a piezoelectric element formed on the upper surface of the vertical driving beam 170A and includes a piezoelectric thin film, an upper electrode formed on the upper surface of the piezoelectric thin film, and a lower electrode formed on the lower surface of the piezoelectric thin film. Each vertical driving source 171B is a piezoelectric element formed on the upper surface of the vertical driving beam 170B and includes a piezoelectric thin film, an upper electrode formed on the upper surface of the piezoelectric thin film, and a lower electrode formed on the lower surface of the piezoelectric thin film.

In each of the vertical driving beams 170A and 170B, a driving voltage with a first waveform and a driving voltage with a second waveform obtained by vertically inverting the first waveform with reference to the median value of the first waveform are applied to vertical driving sources 171A/171B on adjacent vertical beams 173X1-173X2 or 173Y1-173Y2 to cause the adjacent vertical beams to warp in opposite vertical directions, and the accumulation of the vertical movement of the vertical beams is transmitted to the movable frame 160. In the present embodiment, each of the first waveform and the second waveform is a sawtooth waveform. With the movement of the vertical driving beams 170A and 170B, the mirror 110 connected to the movable frame 160 rotates (or oscillates) around a rotation axis that is orthogonal to the horizontal-rotation axis AXH. The direction of this rotation (or oscillation) is referred to as a vertical direction, and this rotation axis that passes through the center of the light reflection surface of the mirror 110 is referred to as a vertical-rotation axis AXV. For example, nonresonant oscillation may be used for the vertical driving by the vertical driving beams 170A and 170B.

For example, the vertical driving source 171A includes vertical driving sources 171A1 and 171A2 that are formed on the first and second vertical beams 173X1 and 173X2 constituting the vertical driving beam 170A. The vertical driving source 171B includes vertical driving sources 171B1 and 171B2 that are formed on the first and second vertical beams 173Y1 and 173Y2 constituting the vertical driving beam 170B. In this case, the movable frame 160 connected to the mirror 110 can be rotated in the vertical direction by driving the vertical driving sources 171A1 and 171B1 using the first waveform and driving the vertical driving sources 171A2 and 171B2 using the second waveform that is obtained by vertically inverting the first waveform with reference to the median value of the first waveform.

In the optical scanning device of the present embodiment, the MEMS structure implementing the actuator is formed of a silicon-on-insulator (SOI) substrate including a support layer, a buried oxide (BOX) layer, and an active layer. Each of the fixed frame 180 and the movable frame 160 is comprised of the support layer, the BOX layer, and the active layer. On the other hand, each of components such as the horizontal driving beams 130A and 130B and the vertical driving beams 170A and 170B other than the fixed frame 180 and the movable frame 160 may be comprised of the active layer alone (one layer) or comprised of the BOX layer and the active layer (two layers).

In the optical scanning device of the present embodiment, the horizontal driving sources 131A and 131B are formed on first surfaces (upper surfaces) of the horizontal beams constituting the horizontal driving beams 130A and 130B, and ribs 132 are formed on second surfaces (lower surfaces) of the horizontal beams. The ribs 132 are positioned in the middle of the horizontal beams, i.e., along the horizontal-rotation axis AXH. Each rib 132 has a width in the longitudinal direction of the horizontal beam and a length in the lateral direction of the horizontal beam, and the width of the rib 132 is shorter than the length of the rib 132. For example, when a wafer including multiple MEMS structures is diced to manufacture separate MEMS structures, the ribs 132 formed on the second surfaces (lower surfaces) of the horizontal beams constituting the horizontal driving beams 130A and 130B can prevent the bellows structures from being excessively vibrated and damaged by a water flow and vibration generated during the dicing.

Also in the optical scanning device of the present embodiment, the vertical driving sources 171A and 171B are formed on first surfaces (upper surfaces) of the vertical beams 173X1, 173X2, 173Y1, and 173Y2 constituting the vertical driving beams 170A and 170B, and ribs 172 are formed on second surfaces (lower surfaces) of the vertical beams 173X1, 173X2, 173Y1, and 173Y2. Each of the ribs 172 is positioned such that a distance from the joint between the corresponding one of the vertical beams 173X1, 173X2, 173Y1, and 173Y2 and the corresponding one of the turn-around parts 171X and 171Y becomes 10 to 20% of the length of the vertical beams 173X1, 173X2, 173Y1, and 173Y2. Each of the ribs 172 has a width in the longitudinal direction of the vertical beams 173X1, 173X2, 173Y1, and 173Y2 and a length in the lateral direction of the vertical beams 173X1, 173X2, 173Y1, and 173Y2, and the width of the ribs 172 is shorter than the length of the ribs 172. The ribs 172 formed on the second surfaces (lower surfaces) of the vertical beams constituting the vertical driving beams 170A and 170B can prevent the vertical driving beams 170A and 170B from unnecessarily warping in a direction (the width or lateral direction of the vertical beams 173X1, 173X2, 173Y1, and 173Y2) that is orthogonal to the direction of vertical warping of the vertical driving beams 170A and 170B and thereby reduce the displacement of the mirror support 120 in the thickness direction.

In the optical scanning device of the present embodiment, a rib is also formed on the lower surface of the mirror support 120 that is opposite a surface of the mirror support 120 on which the mirror 110 is formed. The rib formed on the lower surface of the mirror support 120 can prevent the mirror support 120 from unnecessarily warping.

The ribs 172 formed on the second surfaces (lower surfaces) of the vertical beams 173X1, 173X2, 173Y1, and 173Y2 constituting the vertical driving beams 170A and 170B have a height that is the same as the height (thickness) of the fixed frame 180 and the movable frame 160. When the MEMS structure that functions as an actuator of the optical scanning device is formed of an SOI substrate, the ribs 172 are formed of the BOX layer and the support layer on the lower surfaces of the vertical beams 173X1, 173X2, 173Y1, and 173Y2 formed of the active layer. The horizontal beams constituting the horizontal driving beams 130A and 130B are formed of the active layer, and the ribs 132 formed on the second surfaces (lower surfaces) of the horizontal beams are formed of the BOX layer and the support layer. The mirror support 120 is formed of the active layer, and the rib on the lower surface of the mirror support 120 (the surface that is opposite a surface of the mirror support 120 on which the mirror 110 is formed) is formed of the BOX layer and the support layer. Instead of using the support layer of an SOI substrate, the ribs may be formed as steps by etching bulk silicon.

Figure 3:
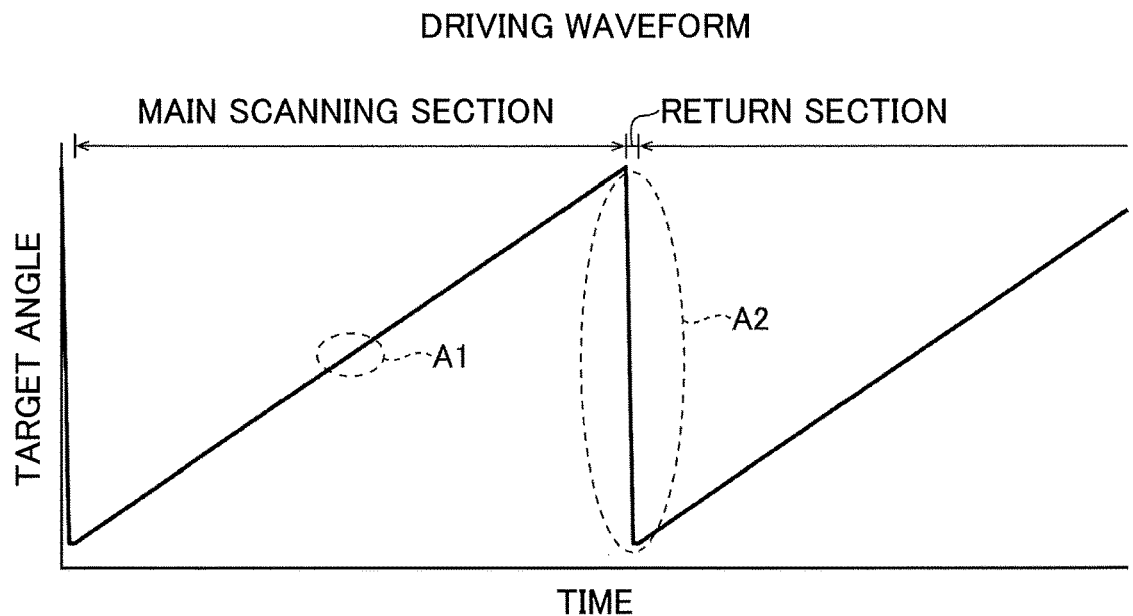
FIG. 3 is a graph indicating an example of a driving waveform for driving an optical scanner of an optical scanning device according to an embodiment.

FIG. 3 is a graph indicating an example of a driving waveform for driving the optical scanner 100 of the optical scanning device according to the present embodiment. For example, the driving waveform of FIG. 3 is input to the vertical driving sources 171A and 171B. In FIG. 3, the horizontal axis indicates time, and the vertical axis indicates a target angle of the mirror 110. As indicated by FIG. 3, the driving waveform is a sawtooth waveform. On cycle of the sawtooth waveform includes a main scanning section and a return section. In the main scanning section, the angle changes as time passes from an initial angle at a constant rate and reaches a predetermined angle at the end of the main scanning section. In the return section, the angle returns from the predetermined angle at the end of the main scanning section to the initial angle.

Figure 4:
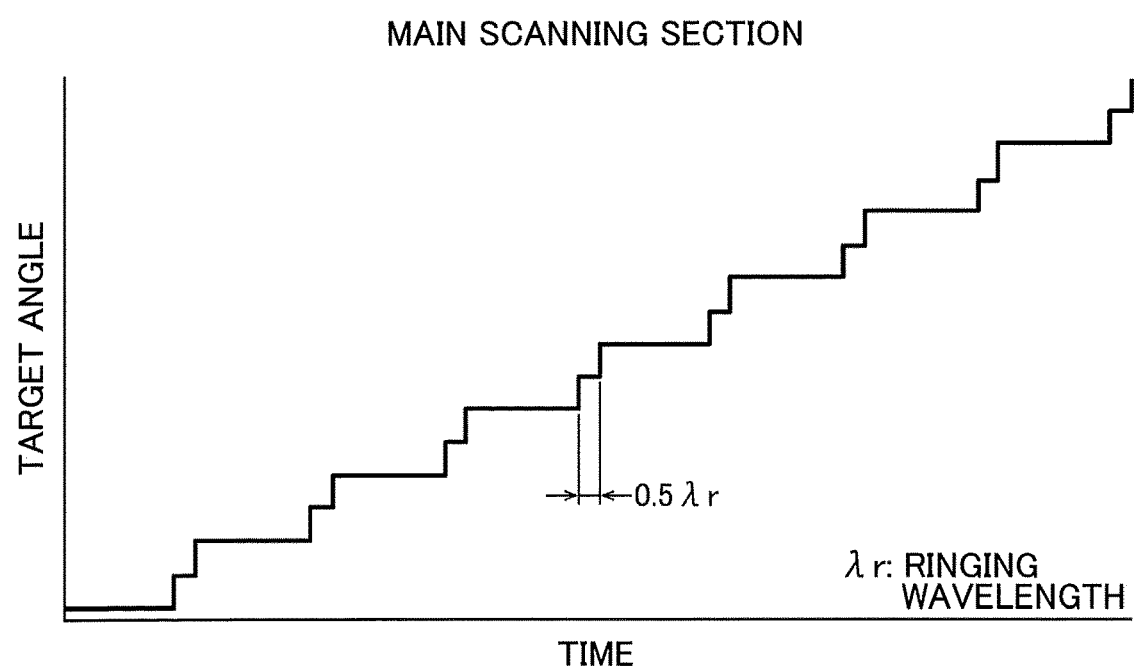
FIG. 4 is a graph indicating a waveform of a main scanning section corresponding to a rising section of a driving waveform.

FIG. 4 is a graph indicating a waveform of the main scanning section corresponding to a rising section of the driving waveform. That is, FIG. 4 is an enlarged view of an area A1 in FIG. 3. As indicated by FIG. 4, the main scanning section of the sawtooth waveform is shaped like steps. Specifically, the main scanning section includes a first step-like waveform, a second step-like waveform, and a ringing suppression waveform between the first step-like waveform and the second step-like waveform. The ringing suppression waveform generates oscillation that is in opposite phase with a ringing waveform. The ringing suppression waveform has a wavelength that is one half (0.5) of a ringing wavelength λr. That is, in each step, the waveform rises in two sub-steps at a time interval that is one half (½) of the ringing wavelength λr. Ringing generated by the first step-like waveform and ringing generated by the second step-like waveform cancel each other. Details of the cancellation of ringing are described later.

Figure 5:
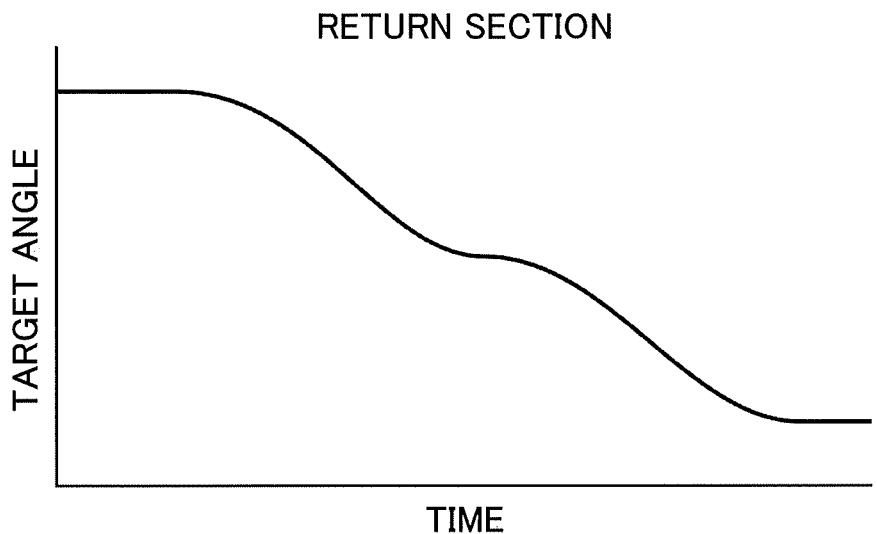
FIG. 5 is a graph indicating a waveform of a return section corresponding to a falling section of a driving waveform.

FIG. 5 is a graph indicating a waveform of the return section corresponding to a falling section of the driving waveform. That is, FIG. 5 is an enlarged view of an area A2 in FIG. 3. As illustrated in FIG. 5, in the return section, the angle returns to the initial angle in two curved steps.

Figure 6:
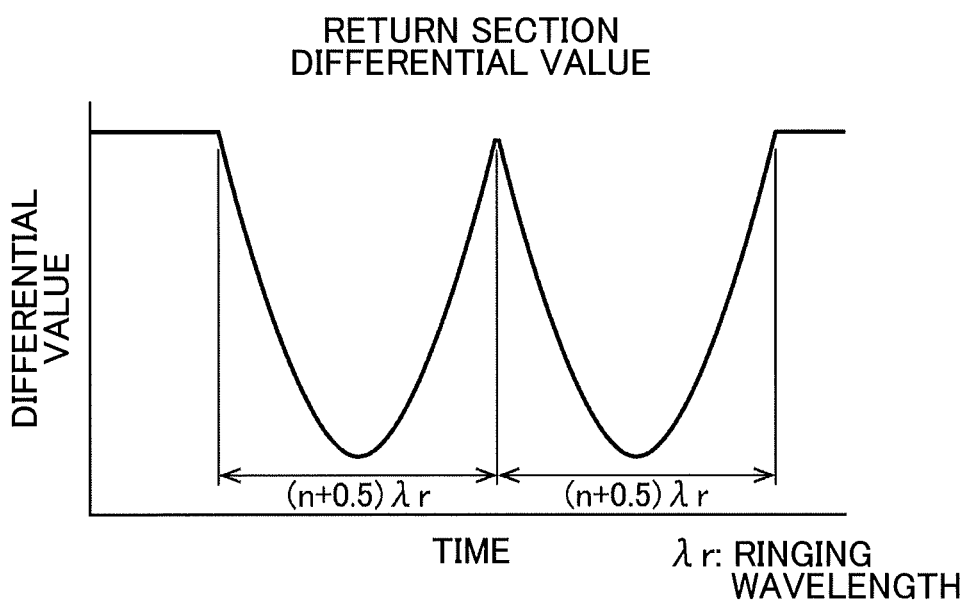
FIG. 6 is a graph indicating a differential waveform of a return section corresponding to a falling section of a driving waveform.

FIG. 6 is a graph indicating a differential waveform of the return section corresponding to the falling section of the driving waveform. When the waveform of the return section in FIG. 5 including two curved steps is differentiated, a waveform formed of two consecutive half sine waves is obtained as illustrated in FIG. 6.

In the present embodiment, when λr indicates the ringing wavelength, the wavelength of each half sine wave is represented by "(n+0.5)λr". When the optical scanner is driven at a driving frequency that is 1/n (n is a positive integer) of the ringing frequency, ringing is caused by an n-th harmonic component of the driving frequency. In the present embodiment, a waveform formed of two consecutive half sine waves with the same wavelength is obtained by differentiating the driving waveform of the return section. The wavelength of each half sine wave is (n+0.5) times the ringing wavelength. That is, the frequency of the half sine wave is 1/(n+0.5) times the ringing frequency. The half sine wave is less likely to include other frequency components. Also, because the frequency of the half sine wave is 1/(n+0.5) times the ringing frequency, the ringing frequency is between the n-th harmonic component and the (n+1)th harmonic component, and components causing ringing are greatly reduced. Also, when a waveform formed of two consecutive half sine waves with the same wavelength is obtained by differentiating an input waveform, the phase of the second half sine wave is shifted from the phase of the first half sine wave by a (n+0.5) cycle of the ringing frequency component. Accordingly, the ringing component generated in the first half sine wave is canceled by the opposite phase. For the above reasons, the present embodiment makes it possible to greatly reduce ringing. For example, "n" may be set at 3, and half sine waves with a wavelength that is 3.5 times the ringing wavelength may be used.

Figure 7:
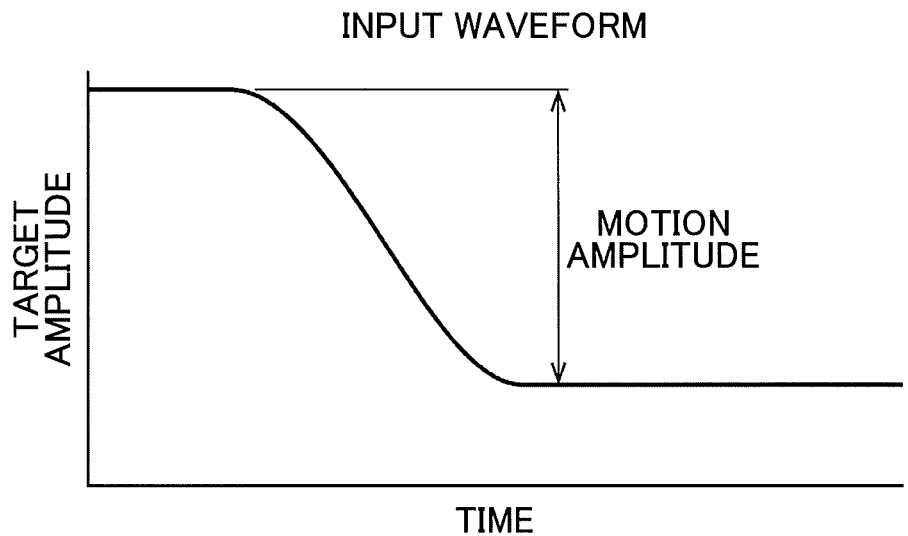
FIG. 7 is a graph indicating another exemplary waveform of a return section corresponding to a falling section of a driving waveform.
Figure 8:
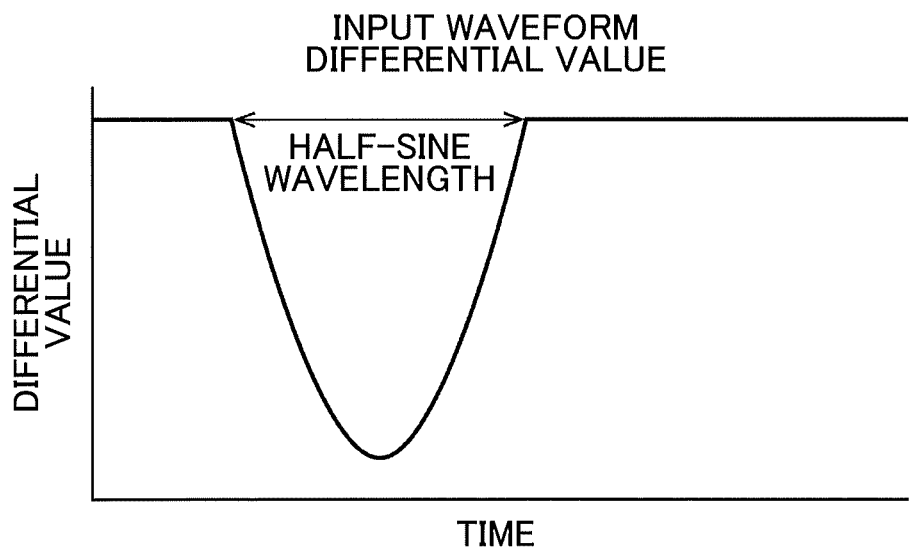
FIG. 8 is a graph indicating a differential waveform of the waveform of the return section in FIG. 7.

FIG. 7 is a graph indicating another exemplary waveform of a return section corresponding to a falling section of a driving waveform. When the input waveform of FIG. 7 is differentiated, a waveform composed on one half sine wave is obtained. FIG. 8 is a graph indicating a differential waveform of the waveform of the return section in FIG. 7. When the input waveform of FIG. 7 is differentiated, a waveform formed of one half sine wave is obtained as illustrated in FIG. 8. Here, to confirm only the influence of the return section, it is assumed that the amplitude does not change before and after the return section, and the difference between the mirror angle at the beginning of the return section and the mirror angle at the end of the return section is referred to as a motion amplitude.

Figure 9:
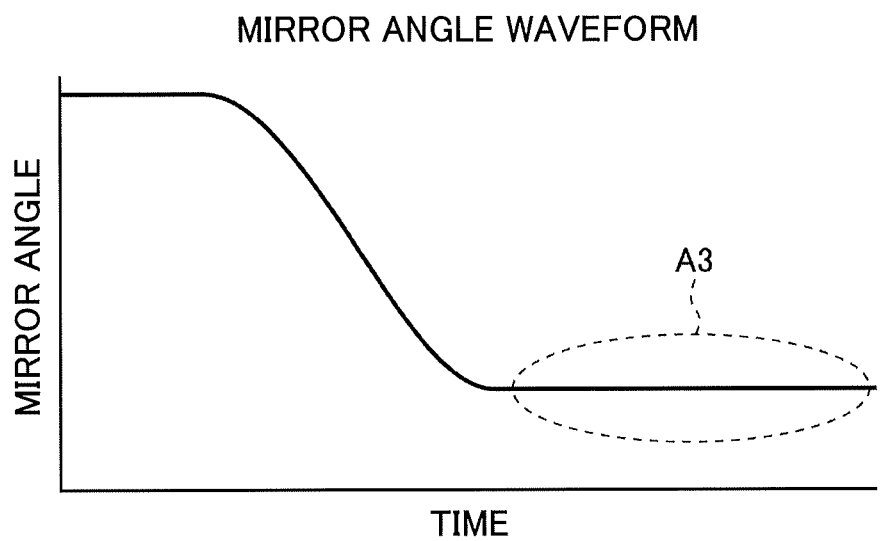
FIG. 9 is a graph indicating a mirror angle waveform of a return section.
Figure 10:
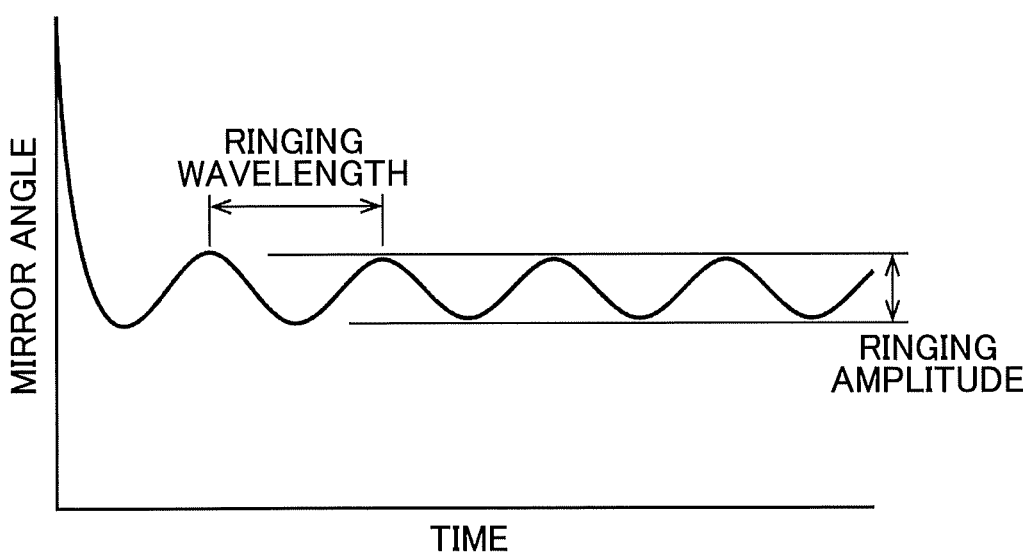
FIG. 10 is an enlarged view of a portion of the mirror angle waveform of FIG. 9.

FIG. 9 is a graph indicating a mirror angle waveform of a return section. FIG. 9 indicates a mirror angle obtained by a simulation where a mirror is driven by the input waveform of FIG. 7. FIG. 10 is an enlarged view of a portion of the mirror angle waveform of FIG. 9, and corresponds to an area A3 in FIG. 9. As illustrated in FIG. 9, in the return section, the mirror angle is returned according to the input waveform to a predetermined angle and is then becomes a constant value. After the mirror angle becomes constant, ringing occurs as illustrated in FIG. 10. The wavelength and the amplitude of the ringing waveform in FIG. 10 change depending on the input waveform of FIG. 7.

Figure 11:
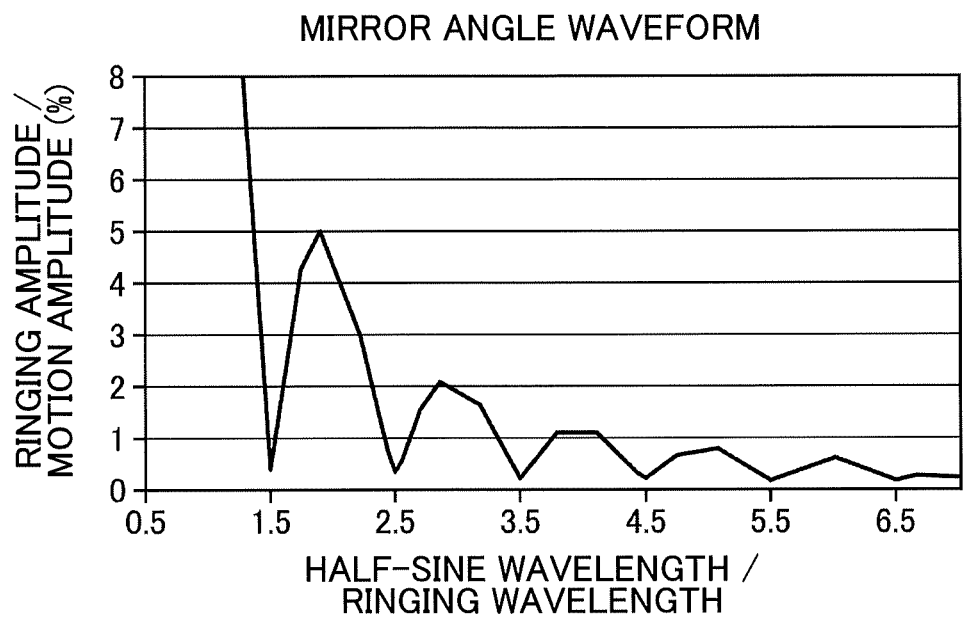
FIG. 11 is a graph indicating a relationship between a ringing amplitude and a half-sine wavelength of a differential waveform of an input waveform.

FIG. 11 is a graph indicating a relationship between a ringing amplitude and the wavelength of a half sine wave (half-sine wavelength) of a differential waveform of an input waveform. In FIG. 11, the horizontal axis indicates "half-sine wavelength/ringing wavelength", and the vertical axis indicates "ringing amplitude/motion amplitude". FIG. 11 indicates values of the ringing amplitude obtained by changing the half-sine wavelength of the differential waveform by changing the input waveform of FIG. 7. In the horizontal axis, the half-sine wavelength is indicated by its ratio to the ringing wavelength. In the vertical axis, the ringing amplitude is indicated by its ratio to the motion amplitude. The ringing amplitude is minimum when the wavelength of the half sine wave is (n+0.5) times (e.g., 1.5 times, 2.5 times, 3.5 times, . . . ) the ringing wavelength. This is because components causing ringing are greatly reduced when the ringing frequency is between the n-th harmonic component and the (n+1)th harmonic component. As described above, the ringing amplitude becomes minimum when the wavelength of the half sine wave is (n+0.5) times the ringing wavelength. For example, the wavelength of the half sine wave may be set at a value other than integral multiples (e.g., (n+0.4) and (n+0.6)) of the ringing wavelength to decrease the ringing amplitude. That is, for each purpose of the optical scanning device, the wavelength of the half sine wave may be set at any appropriate multiple of the ringing wavelength that can achieve a ringing amplitude that does not cause a substantial problem.

Figure 12:
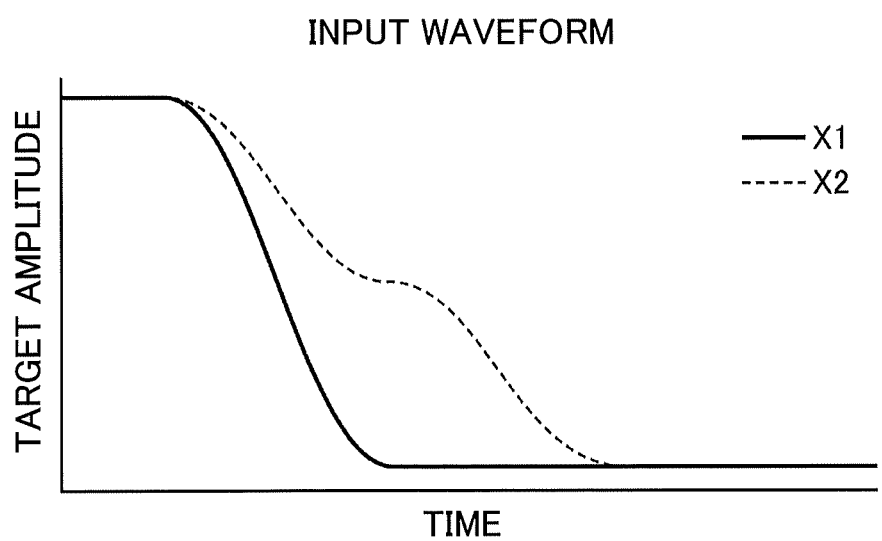
FIG. 12 is a graph indicating exemplary waveforms of a return section.
Figure 13:
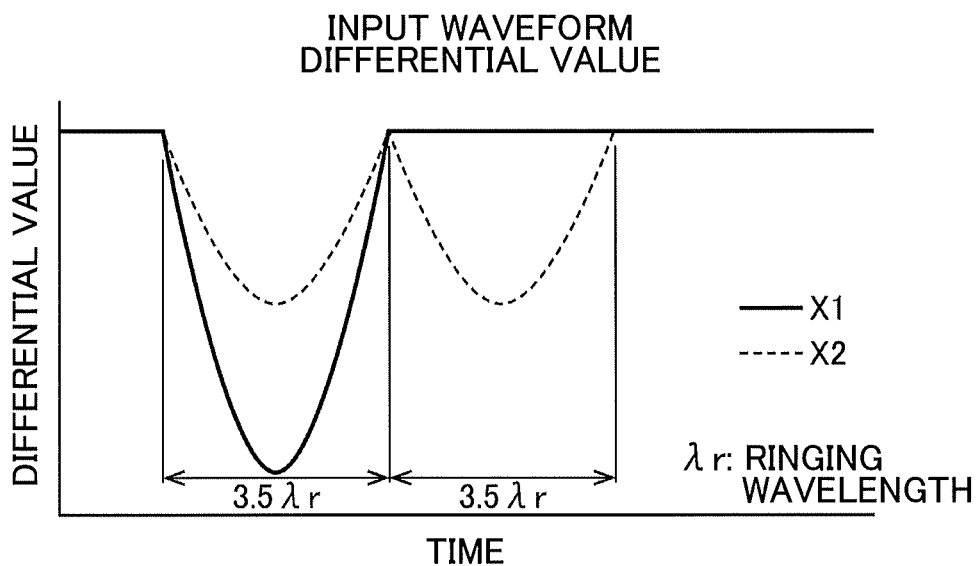
FIG. 13 is a graph indicating differential waveforms of the waveforms of the return section in FIG. 12.

FIG. 12 is a graph indicating exemplary waveforms of a return section. When the input waveforms of FIG. 12 are differentiated, a waveform X1 composed on one half sine wave and a waveform X2 formed of two consecutive half sine waves are obtained. FIG. 13 is a graph indicating differential waveforms of the waveforms of the return section in FIG. 12. When the input waveform X1 in FIG. 12 is differentiated, a waveform X1 formed of one half sine wave is obtained as illustrated in FIG. 13. The wavelength of the half sine wave is 3.5 times the ringing wavelength λr. Also, when the input waveform X2 in FIG. 12 is differentiated, a waveform X2 formed of two consecutive half sine waves is obtained as illustrated in FIG. 13. The wavelength of each of the two half sine waves is 3.5 times the ringing wavelength λr. Here, to confirm only the influence of the return section, it is assumed that the amplitude does not change before and after the return section.

Figure 14:
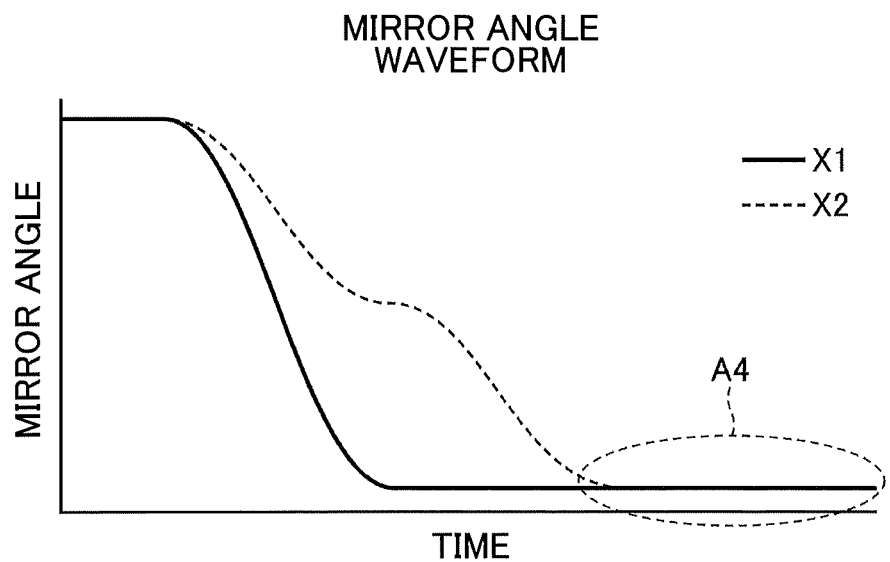
FIG. 14 is a graph indicating mirror angle waveforms of a return section.
Figure 15:
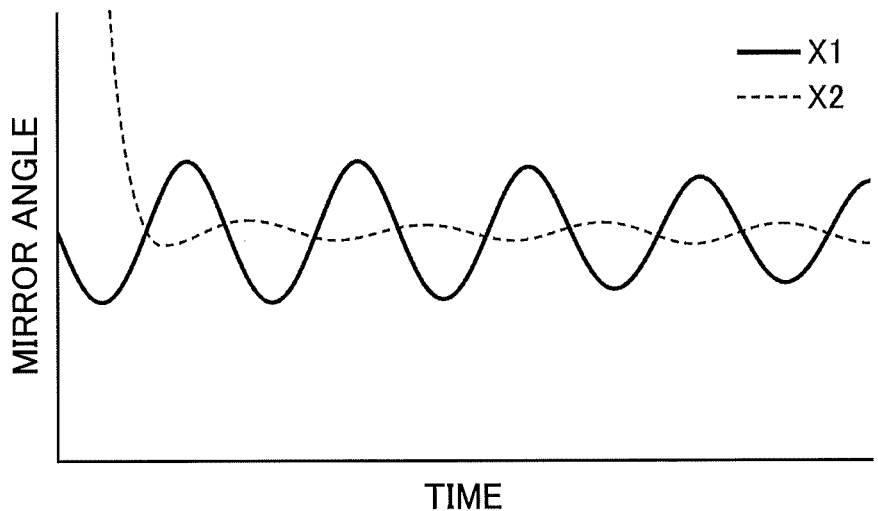
FIG. 15 is an enlarged view of portions of the mirror angle waveforms of FIG. 14.

FIG. 14 is a graph indicating mirror angle waveforms of a return section. FIG. 14 indicates mirror angles obtained by a simulation where a mirror is driven by the input waveforms of FIG. 12. FIG. 15 is an enlarged view of portions of the mirror angle waveforms of FIG. 14, and corresponds to an area A4 in FIG. 14. As illustrated in FIG. 14, in the return section, the mirror angle is returned according to the input waveforms to a predetermined angle and is then becomes a constant value. After the mirror angle becomes constant, ringing occurs as illustrated in FIG. 15. The wavelength and the amplitude of the ringing waveform in FIG. 15 change depending on the input waveform of FIG. 12. As indicated by FIG. 15, the ringing of the waveform X2 corresponding to the waveform X2 in FIG. 12 formed of two consecutive half sine waves is far smaller than the ringing of the waveform X1 corresponding to the waveform X1 in FIG. 12 formed of one half sine wave.

Figure 16:
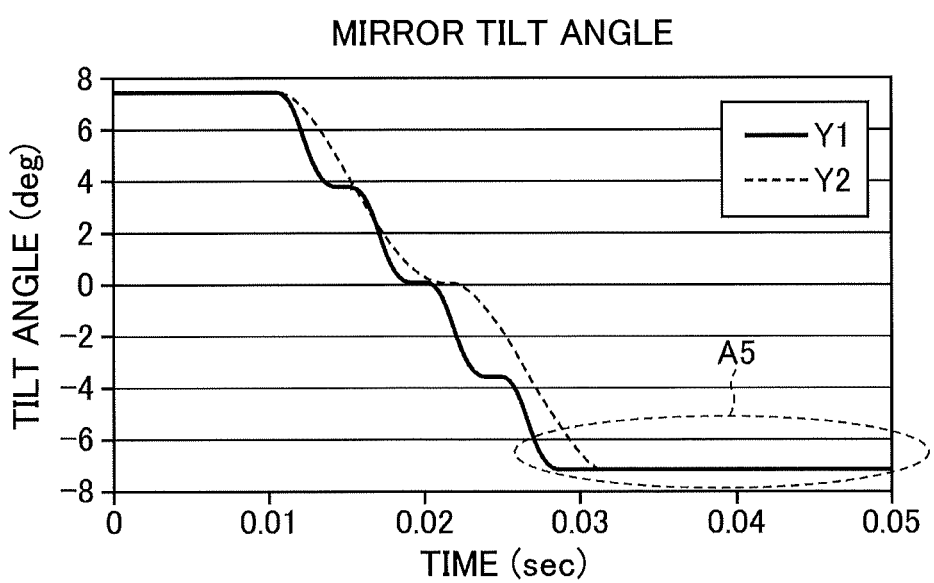
FIG. 16 is a graph indicating mirror tilt angle waveforms of a return section.
Figure 17:
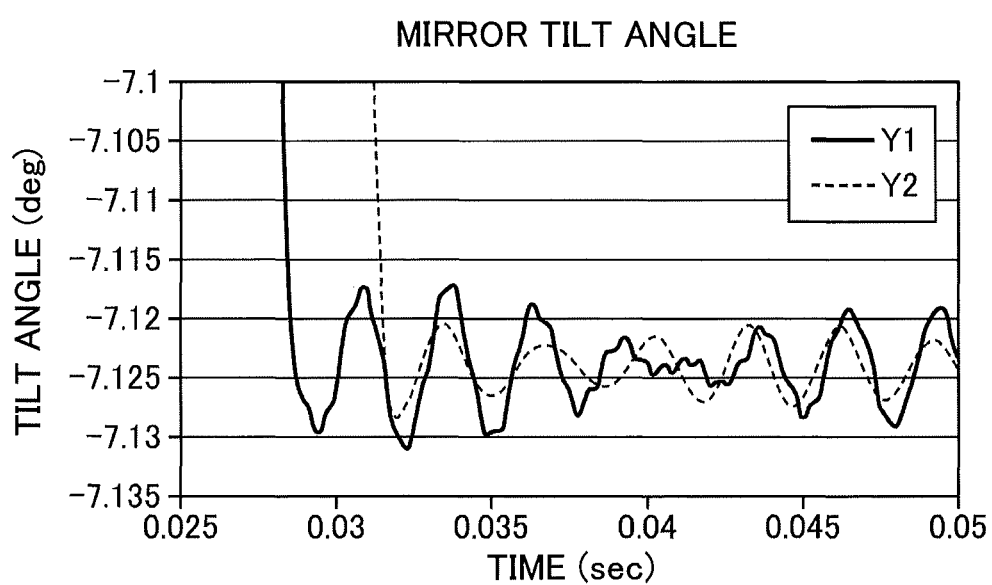
FIG. 17 is an enlarged view of portions of the mirror tilt angle waveforms of FIG. 16.

FIG. 16 is a graph indicating mirror tilt angle waveforms of a return section obtained by a simulation. FIG. 16 indicates a waveform Y1 whose differential waveform is formed of four consecutive half sine waves with a wavelength of 1.5 λr and a waveform Y2 whose differential waveform is formed of two consecutive half sine waves with a wavelength of 3.5 λr. FIG. 17 is an enlarged view of portions of the mirror tilt angle waveforms of FIG. 16, and corresponds to an area A5 in FIG. 16. As illustrated in FIG. 16, in the return section, the mirror angle is returned according to the input waveforms to a predetermined angle and is then becomes a constant value. After the mirror angle becomes constant, ringing occurs as illustrated in FIG. 17. As illustrated in FIG. 17, the ringing of the waveform Y2 whose differential waveform is formed of two consecutive half sine waves with a wavelength of 3.5 λr is smaller than the ringing of the waveform Y1 whose differential waveform is formed of four consecutive half sine waves with a wavelength of 1.5 λr.

As described above, in the optical scanner of the optical scanning device of the present embodiment, a sawtooth waveform is used as the driving waveform, and the differential waveform of the falling section of the driving waveform is formed of half sine waves with a wavelength that is (n+0.5) (n is a positive integer) times the ringing wavelength. Because the frequency of the half sine wave is 1/(n+0.5) times the ringing frequency, the ringing frequency is between the n-th harmonic component and the (n+1)th harmonic component, and components causing ringing are greatly reduced. Also, the differential waveform is formed of an even number of consecutive half sine waves with the same wavelength. With this configuration, the phase of an even-numbered half sine wave is shifted from the phase of an odd-numbered half sine wave by a (n+0.5) cycle of the ringing frequency component, and the ringing component generated in the odd-numbered half sine wave is canceled by the ringing component with the opposite phase generated in the even-numbered half sine wave. Thus, the present embodiment makes it possible to greatly reduce ringing.

Figure 18:
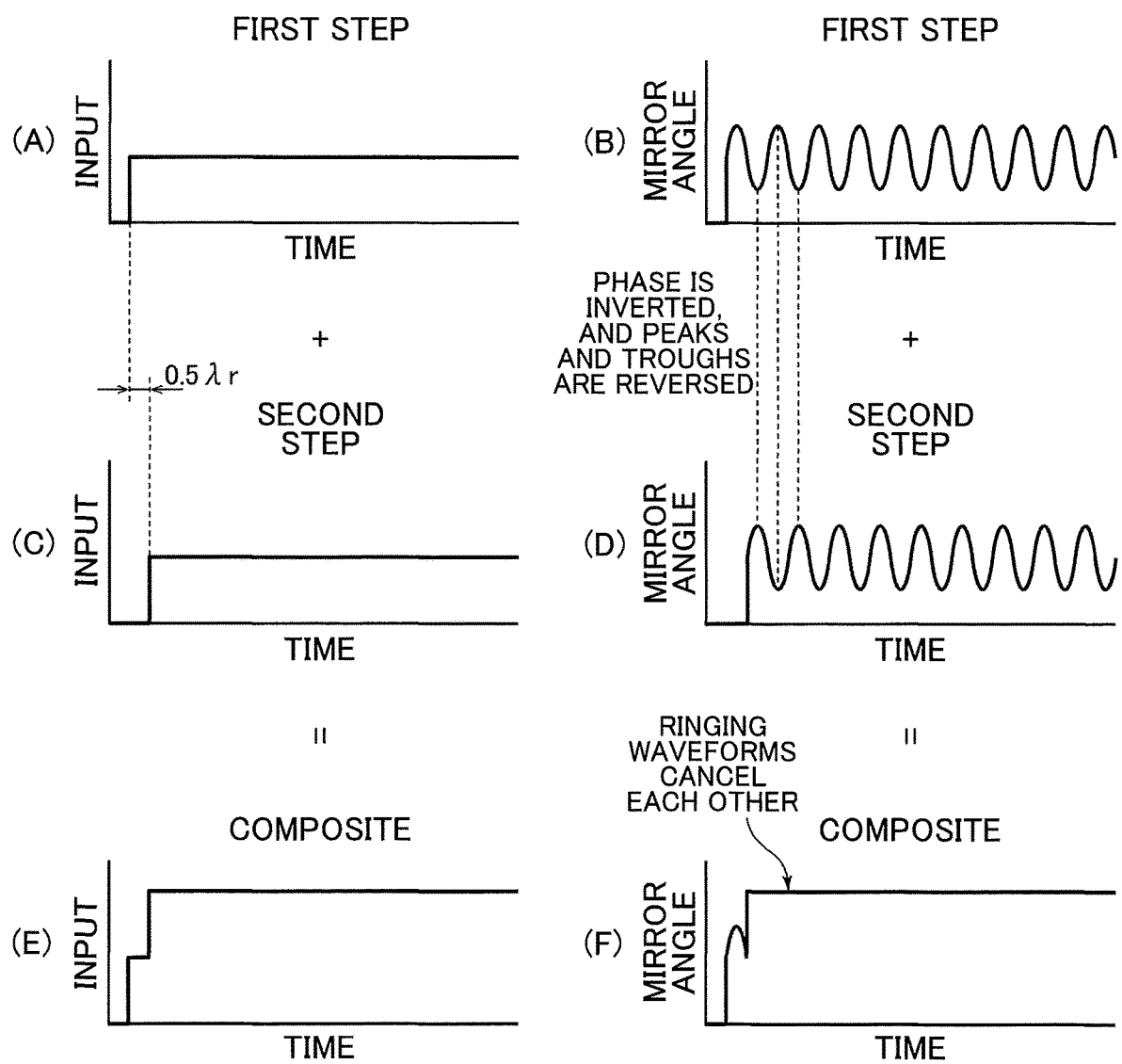
FIG. 18 is a drawing illustrating a mirror angle waveform corresponding to an input waveform of a main scanning section.

FIG. 18 is a drawing illustrating a mirror angle waveform corresponding to an input waveform of a main scanning section. FIG. 18 (A) indicates a first step-like waveform. FIG. 18 (B) indicates a mirror angle resulting from the input of the first step-like waveform of FIG. 18 (A). In FIG. 18 (B), ringing occurs after the mirror angle is changed by the first step-like waveform. FIG. 18 (C) indicates a second step-like waveform. The second step-like waveform rises after 0.5 λr from the rise of the first step-like waveform. FIG. 18 (D) indicates a mirror angle resulting from the input of the second step-like waveform of FIG. 18 (C). FIG. 18 (D) indicates a mirror angle that is obtained when only the second step-like waveform is taken into account. The waveform of FIG. 18 (D) is obtained by delaying the rise of the waveform of FIG. 18 (B) by 0.5 λr. FIG. 18 (E) indicates a waveform obtained by combining the waveforms of FIG. 18 (A) and FIG. 18 (C). FIG. 18 (F) indicates a mirror angle resulting from the input of the waveform of FIG. 18 (E), and corresponds to a waveform obtained by combining the waveforms of FIG. 18 (B) and FIG. 18 (D). The phase of ringing in FIG. 18 (B) is the opposite of the phase of ringing in FIG. 18 (D). That is, the peaks and troughs of the waveform of FIG. 18 (B) are inverted in FIG. 18 (D). When combined, the ringing waveforms of FIG. 18 (B) and FIG. 18 (D) cancel each other and ringing disappears. As a result, a flat mirror angle waveform with no ringing can be obtained.

As described above, in the optical scanner of the optical scanning device of the present embodiment, the driving waveform of the main scanning section includes a first step-like waveform corresponding to FIG. 18 (A), a second step-like waveform corresponding FIG. 18 (C), and a ringing suppression waveform between the first step-shape waveform and the second step-shape waveform. The ringing suppression waveform generates oscillation that is in opposite phase with a ringing waveform.

In the driving waveform illustrated in FIG. 18, ringing generated by the first step-like waveform and ringing generated by the second step-like waveform cancel each other.

The ringing suppression waveform has a wavelength that is 0.5 times the ringing wavelength λr. The ringing waveform of the first step-like waveform and the ringing waveform of the second step-like waveform are shifted from each other by 0.5 λr and therefore cancel each other. Accordingly, ringing can be canceled and a flat mirror angle waveform can be obtained by combining these waveforms.

The driving waveform of the main scanning section includes multiple pairs of the first step-like waveform and the second step-like waveform. In each pair of the first step-like waveform and the second step-like waveform, the ringing waveforms cancel each other. This effect can be combined with the ringing suppression effect achieved by a configuration where the differential waveform of the falling section of the driving waveform is formed of half sine waves with a wavelength that is (n+0.5) (n is a positive integer) times the ringing wavelength.

Figure 19:
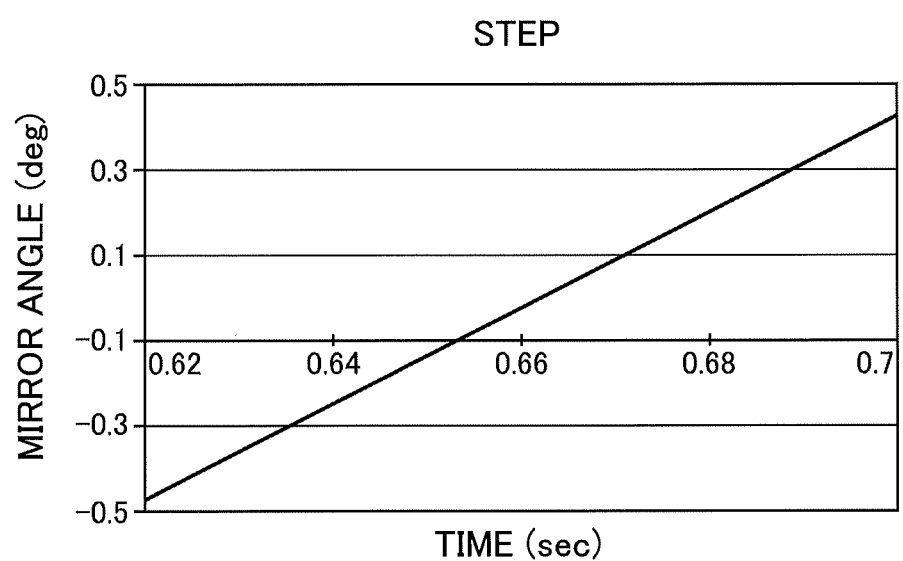
FIG. 19 is a graph indicating an input waveform of a main scanning section according to a variation.

FIG. 19 is a graph indicating an input waveform of a main scanning section according to a variation. In the main scanning section in FIG. 19, the mirror angle changes gradually rather than stepwise. Also in this variation, a sawtooth waveform is used as the driving waveform, and the differential waveform of the falling section of the driving waveform is formed of half sine waves with a wavelength that is (n+0.5) (n is a positive integer) times the ringing wavelength to suppress ringing.

An actuator and an optical scanning device according to the embodiment of the present invention are described above. However, the present invention is not limited to the specifically disclosed embodiment, and variations and modifications may be made without departing from the scope of the present invention. For example, although an actuator is used for an optical scanning device including a mirror in the above embodiment, the actuator may also be used to drive an object other than a mirror, and the present invention may also be applied to a device that does not include a mirror. In the above embodiment, a piezo-drive actuator using a piezoelectric thin film as a driving source is described. However, the present invention may also be applied to a different type of electromagnetic actuator and an electrostatic actuator. An optical scanning device according to an embodiment of the present invention is preferably used for an optical coherence tomography device of a funduscope. In an optical coherence tomography device of a funduscope, resonant driving is not necessary because one of the axes operates at high speed as in a projector, and it is desired that tilt angles can be freely set and adjusted to perform optical scanning. Accordingly, an optical scanner where nonresonant driving is used for both of two axes as in the above embodiment is preferably used for an optical coherence tomography device of a funduscope. An optical scanning device according to an embodiment of the present invention may also be used for a projection device.

This disclosure makes it possible to suppress ringing that occurs only in a return section of a sawtooth waveform rather than in the entire sawtooth waveform and makes it possible to suppress ringing regardless of the waveform of sections other than the return section.

This disclosure makes it possible to suppress ringing by using a configuration where the differential waveform of the falling section of the driving waveform is formed of half sine waves with a wavelength that is (n+0.5) (n is a positive integer) times the ringing wavelength.

What is claimed is:

1. An actuator, comprising:
a beam that supports an object to be driven: and
a driving source that receives a driving signal and causes the object to rotate around a predetermined axis, wherein
the driving signal includes a sawtooth driving waveform; and
a differential waveform of a falling section of the sawtooth driving waveform is formed of half sine waves having a wavelength that is a non-integral multiple of a ringing wavelength.

2. The actuator as claimed in claim 1, wherein the wavelength is (n+0.5) (n is a positive integer) times the ringing wavelength.

3. The actuator as claimed in claim 1, wherein
the beam comprises multiple beams extending in a direction orthogonal to the predetermined axis; and
ends of each adjacent pair of the beams are connected to each other via a turnaround part such that the beam forms a zig-zag bellows structure as a whole.

4. The actuator as claimed in claim 1, wherein the beam is a driving beam on which the driving source is formed to rotate the object.

5. The actuator as claimed in claim 1, wherein the differential waveform of the falling section of the sawtooth driving waveform is formed of an even number of consecutive half sine waves.

6. The actuator as claimed in claim 1, wherein
a rising section of the sawtooth driving waveform includes a first step-like waveform, a second step-like waveform, and a ringing suppression waveform between the first step-like waveform and the second step-like waveform, the ringing suppression waveform generating oscillation that is in opposite phase with a ringing waveform.

7. The actuator as claimed in claim 6, wherein ringing generated by the first step-like waveform and ringing generated by the second step-like waveform cancel each other.

8. The actuator as claimed in claim 6, wherein a wavelength of the ringing suppression waveform is 0.5 times the ringing wavelength.

9. The actuator as claimed in claim 1, wherein the rising section of the sawtooth driving waveform corresponds to a main scanning section of scanning by the actuator.

10. The actuator as claimed in claim 9, wherein the falling section of the sawtooth driving waveform corresponds to a return section between the main scanning section and a next main scanning section.

11. The actuator as claimed in claim 5, wherein the differential waveform of the falling section of the sawtooth driving waveform is formed of two consecutive half sine waves having a wavelength that is 3.5 times the ringing wavelength.

12. The actuator as claimed in claim 5, wherein the differential waveform of the falling section of the sawtooth driving waveform is formed of four consecutive half sine waves having a wavelength that is 1.5 times the ringing wavelength.

13. An optical scanning device, comprising:
a minor including a light reflection surface;
a mirror support that supports the mirror;
a driving beam that supports the mirror support and includes multiple beams extending in a direction orthogonal to a predetermined axis, ends of each adjacent pair of the beams being connected to each other via a turnaround part such that the driving beam forms a zig-zag bellows structure as a whole; and
driving sources that are formed on the beams, receive a driving signal, and cause the mirror support to rotate around the predetermined axis, wherein the driving signal includes a sawtooth driving waveform; and
a differential waveform of a falling section of the sawtooth driving waveform is formed of half sine waves having a wavelength that is a non-integral multiple of a ringing wavelength.

14. The optical scanning device as claimed in claim 13, wherein the wavelength is (n+0.5) (n is a positive integer) times the ringing wavelength.

* * * * *